United States Patent [19]

Kohiyama et al.

[11] Patent Number: 4,963,817
[45] Date of Patent: Oct. 16, 1990

[54] METHOD AND APPARATUS FOR DETECTING A PHASE DIFFERENCE BETWEEN TWO DIGITAL SIGNALS

[75] Inventors: Kiyoshi Kohiyama; Hidenaga Takahashi, both of Tokyo, Japan

[73] Assignee: Fujitsu Limited, Kawasaki, Japan

[21] Appl. No.: 372,452

[22] Filed: Jun. 28, 1989

[30] Foreign Application Priority Data

Jun. 28, 1988 [JP] Japan ................................. 63-162094

[51] Int. Cl.$^5$ ........................................... G01R 25/00
[52] U.S. Cl. ................................................. 324/83 D
[58] Field of Search ................. 324/76 R, 77 R, 77 B, 324/77 C, 77 CS, 77 G, 78 R, 78 D, 78 E, 78 F, 79 R, 79 D, 83 R, 83 D, 86; 360/51, 46; 380/17, 31, 38; 375/10, 22, 23, 82, 83

[56] References Cited

U.S. PATENT DOCUMENTS

4,075,698  2/1978  Lode .................................. 324/83 D
4,457,005  6/1984  Burke et al. ........................ 375/82
4,652,838  3/1987  Nossen ................................ 380/6
4,700,241 10/1987  Yasuda et al. ...................... 360/51

Primary Examiner—Michael J. Tokar
Attorney, Agent, or Firm—Staas & Halsey

[57] ABSTRACT

In an apparatus for detecting a phase difference between two digital signals including an n stage delay circuit, an n bit register connected to the n stage delay circuit, a signal encoding means connected to the n bit register, and a compensation circuit connected to the encoder, a test signal is applied to the delay circuit first and two different delayed data are obtained by applying a reference signal to the n bit register twice, the delay characteristics of the delay circuit is calculated by using two different data and the period time of the two reference signals, then a signal to be subjected to phase difference detection is applied to the delay circuit to obtain delayed data by applying a reference signal to the n bit register, the delayed data is compensated at the compensating circuit by using the delay characteristics of the delay circuit. Thus, an accurate phase difference between two digital signals is obtained.

9 Claims, 5 Drawing Sheets

METHOD AND APPARATUS FOR DETECTING A PHASE DIFFERENCE BETWEEN TWO DIGITAL SIGNALS

BACKGROUND OF THE INVENTION

(1) Field of the invention

The present invention relates to a method and apparatus for detecting a phase difference between two digital signals, such as a horizontal synchronizing signal and a system cock which has a three or four times higher frequency than a chrominance subcarrier in a television set. Such phase difference data is necessary for a digital phase detection circuit, especially a digital phase locked loop (PLL) circuit which synchronizes or locks the external signal,

(2) Description of the Related Art

Generally, in a conventional circuit for detecting a phase difference between two analog signals, in other words in a conventional phase comparator circuit for analog signals, it is necessary to add an external capacitor or resistor outside the phase comparator circuit unit. Thus, it is very difficult to integrate the conventional phase comparator circuit for analog signals into a small IC (Integrated Circuit) package. Further, the use of analog elements such as a capacitor C or resistor R in the phase comparator circuit cannot guarantee accuracy of the signal as compared with the accuracy in a digital circuit. Furthermore, the analog circuit is highly susceptible to interference caused by noise. For those reasons, the conventional phase comparator circuit for analog signals is not suitable as a phase comparator circuit for digital signals.

Nevertheless, in a digital PLL circuit, such as a circuit for processing a horizontal synchronizing signal of a digital television set, phase difference information among digital signals is frequently necessary for operation, so it is required to provide a small size phase comparator circuit for detecting a phase difference between two digital signals with guaranteed accuracy.

SUMMARY OF THE INVENTION

It is an object of the present invention to provide a method and apparatus for detecting a phase difference between two digital signals with guaranteed accuracy, in a circuit for processing digital signals in which the package size of the IC is reduced.

According to the present invention, the method and the apparatus for detecting a phase difference between two digital signals is provided. The apparatus according to the present invention includes a delay circuit having n delay elements connected in series and each connecting point (node) is connected to an output terminal thereof, an n bit register which takes in the output signals from the delay circuit when a reference signal is applied to it and delivers the same signals to an encoder, the encoder provided for converting input signals from the register into a numerical value, a selector for selecting a test signal having a shorter cycle than the maximum delay time of the delay circuit, or a signal to be subjected to phase difference detection and supplying the selected signal to the delay circuit, and a compensation circuit for compensating a numerical value from the encoder. In the apparatus as constructed above, the test signal is applied to the delay circuit first and reference signal is applied to the n bit register twice to get two different numerical value during the test signal is transmitted in the delay circuit with a certain delay time, the delay characteristics of the delay circuit are calculated by using two different numerical values and the time period of the two reference signals, then the signal which is to have its phase difference detected is applied to the delay circuit and the reference signal is then applied to the n bit register to obtain a numerical value which indicates a phase difference. This numerical value is applied to the compensation circuit to compensate its value according to the delay characteristics of the delay circuit previously calculated. In this way, an accurate phase difference between the signals applied to the delay circuit and the n bit register is calculated in the compensation circuit.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before describing the preferred embodiments, an explanation will be given of the conventional phase comparator circuit shown in FIGS. 1A to 1C.

Figure 1A:
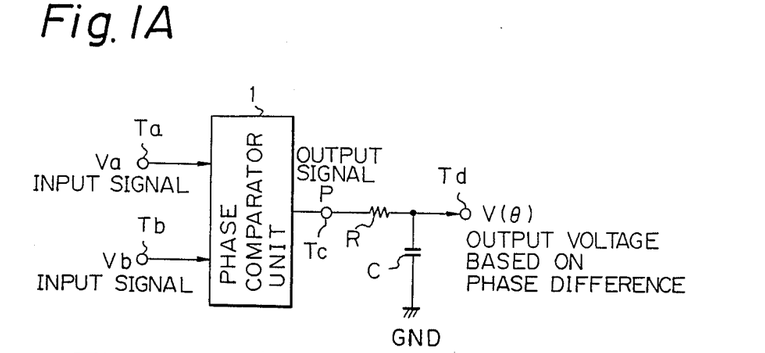
FIG. 1A is a circuit diagram showing a circuit for detecting a phase difference between two analog signals according to the prior art.

FIG. 1A shows a conventional circuit for detecting a phase difference between two analog input signals Va and Vb comprising a well-known phase comparator unit 1 having two input terminals Ta and Tb and an output terminal Tc, an external resistor R connected to the output terminal Tc, and a capacitor C connected between a free end of the resistor R and ground. An output voltage $V(\theta)$ in accordance with the phase difference of two input signals Va and Vb appears at the connecting point Td of the resistor R and the capacitor C of this circuit.

Figure 1B:
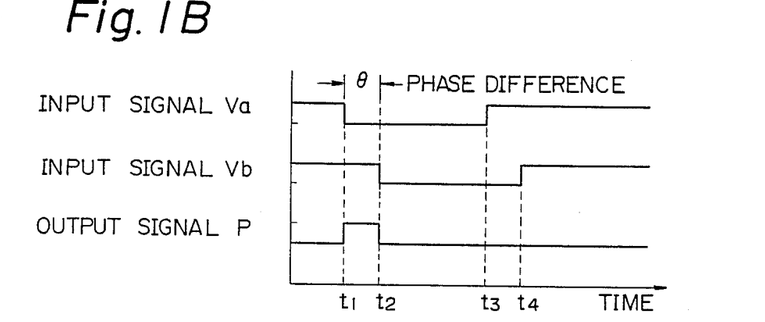
FIGS. 1B, 1C are waveforms for explaining the operation of the circuit for detecting a phase difference as shown in FIG. 1A.

FIG. 1B shows operational waveforms of the circuit shown in FIG. 1A when the input signal Va is leading the input signal Vb and the phase difference between them is $\theta$. When the input signal Va falls from high level "H" to low level "L" at time $t_1$, the output signal P rises from low level "L" to high level "H" at the same time according to the internal operation of the phase comparator unit 1. When the input signal Vb fals from high level "H" to low level "L" at time $t_2$, the output signal P falls from high level "H" to low level "L" at the same time according to the internal operation of the phase comparator unit 1.

Accordingly, when the input signal Va is leading the input signal Vb with the phase difference $\theta$, the output signal P at the output terminal Tc stays at the high level "H" during the time which corresponds to the phase difference $\theta$, and the capacitor C is charged by this output signal P of high level at the output terminal Tc. The voltage $V(\theta)$ of the capacitor C charged by the output signal P appears at the output terminal Td, and this voltage $V(\theta)$ indicates the detected phase difference $\theta$. Note that when the input signal Va rises at time $t_3$ or when the input signal Vb rises at time $t_4$, the output signal P does not change.

Figure 1C:
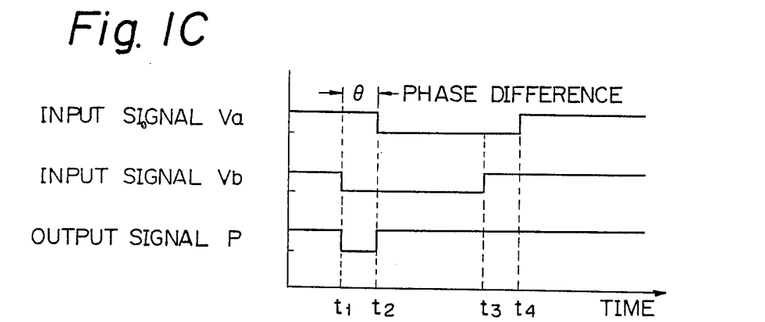

FIG. 1C shows operational waveforms of the circuit shown in FIG. 1A when the input signal Vb is leading the input signal Va and the phase difference between them is also $\theta$. When the input signal Vb falls from high level "H" to low level "L" at time $t_1$, the output signal P falls from high level "H" to low level "L" at the same time according to the internal operation of the phase comparator unit 1. When the input signal Va falls from high level "H" to low level "L" at time $t_2$, the output signal P rises from low level "L" to high level "H" at the same time according to the internal operation of the phase comparator unit 1.

Accordingly, when the input signal Vb is leading the input signal Va with the phase difference $\theta$, the output signal P at the output terminal Tc stays at the low level "L" during the time which corresponds to the phase difference $\theta$, and the capacitor C is discharged by this output signal P of low level at the output terminal Tc. The voltage $V(\theta)$ of the capacitor C charged by the output signal P appears at the output terminal Td, and this voltage $V(\theta)$ indicates the detected phase difference $\theta$. Note that when the input signal Vb rises at time $t_3$ or when the input signal Va rises at time $t_4$, the output signal P does not change.

However, in the conventional phase comparator circuit described above, it is necessary to add an external capacitor C or resistor R outside the phase comparator unit 1. Thus, it is very difficult to integrate the conventional phase comparator circuit for analog signals into a small IC package. Further, the use of analog elaments such as the capacitor C or the resistor R in the circuit cannot guarantee accuracy of the signal as compared with the accuracy of the signal in a digital circuit. Furthermore, the analog circuit is highy susceptible to interference caused by noise. For those reasons, the conventional phase comparator circuit is not suitable for digital signals.

Figure 2:
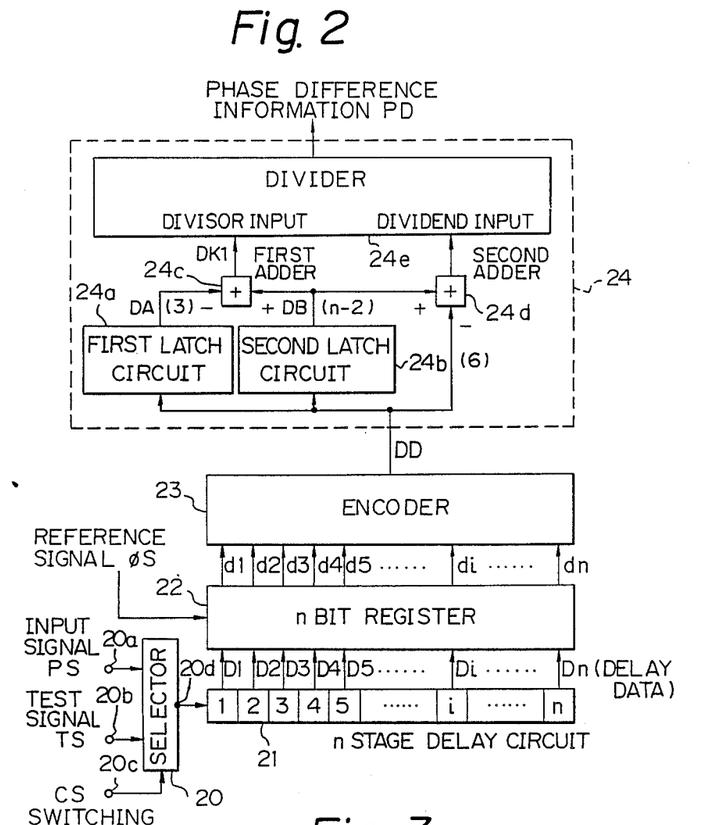
FIG. 2 is a schematic diagram of one embodiment of the circuit for detecting a phase difference between two digital signals according to the present invention.

FIG. 2 shows a circuit diagram of one embodiment for detecting a phase difference between two digital signals according to the present invention. The circuit for detecting a phase difference in this embodiment is composed of a selector 20, an n stage delay circuit 21, an n bit register 22, an encoder 23, and a compensation circuit 24. The selector 20 has two input terminals 20a and 20b for input signal PS and test signal TS, an input terminal 20c for switching signal CS which switches to enable one input terminal 20a or 20b, and an output terminal 20d which is connected to an n stage delay circuit 21. The selector 20 outputs the test signal TS when the switching signal CS is high level "H", and outputs the input signal PS to be subjected to phase difference detection when the switching signal CS is low level "L" at the output terminal 20d. The input signal PS is, for example, a horizontal synchronizing signal (63.5 $\mu$s for one cycle) or an FM (frequency modulation) radio signal.

Figure 3:
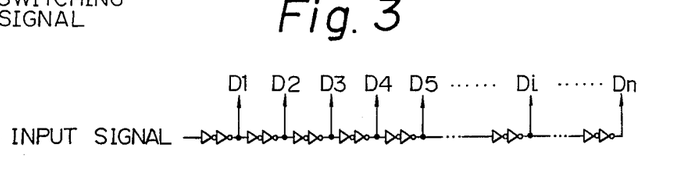
FIG. 3 is a circuit diagram of one embodiment of the delay circuit as shown in FIG. 2.

The n stage delay circuit 21 is composed of series-connected n delay elements each of which has the same delay time. Every connecting point of the n delay elements and the end of the delay element are connected to outputs of the n stage delay circuit 21, so that the input signal PS or the test signal TS appears as delay data from a first output terminal to the last output terminal in turn with the same time separation between terminals. Since the input signal PS and the test signal TS are both digital signals, each output terminal of the n stage delay circuit 21 outputs "H" or "L" level signal. Each delay element can be made, for example, by two inverters connected in series as shown in FIG. 3.

The n bit register 22 is composed of n registers each having an input terminal connected to the n output terminal of the n stage delay circuit 21, an input terminal for a reference signal $\phi$ S, and n output terminals connected to the encoder 23. When the reference signal $\phi$ S is applied to the n bit register 22, the delay data from the n stage delay circuit 21 is taken in by the n bit register 22 and latched there.

Note that the reference signal $\phi$ S is, for example, a system clock (one cycle is about 70 ns) which has a frequency of four times higher than the chrominance subcarrier $f_{sc}$ (=3.58 MHz) in the circuit for processing a digital television signal. These delay data are output to the encoder 23. The encoder 23 converts the applied delay data into a numerical value, for example, when only two of the delay data d1 and d2 from the n bit register are "H", and the rest are all "L", the encoder 23 outputs the numerical value of "3" as an output signal DD.

The compensation circuit 24 is composed of a first latch circuit 24a, a second latch circuit 24b, a first adder 24c, a second adder 24d, and a divider 24e. Input terminals of the first and the second latch circuit 24a and 24b are connected to the encoder 23. The first adder 24c has an inverted input terminal connected to the output terminal of the first latch circuit 24a, a noninverted input terminal connected to the output terminal of the second latch circuit 24b, and an output terminal connected to a divisor input terminal of the divider 24e. The second adder 24d has a noninverted input terminal connected to the output terminal of the connected to the output terminal of the encoder 23, and an output terminal connected to a dividend input terminal of the divider 24e.

The operation of the circuit for detecting a phase difference between the two digital signals will be explained with reference to the waveforms of FIGS. 4 and 5.

Figure 4:
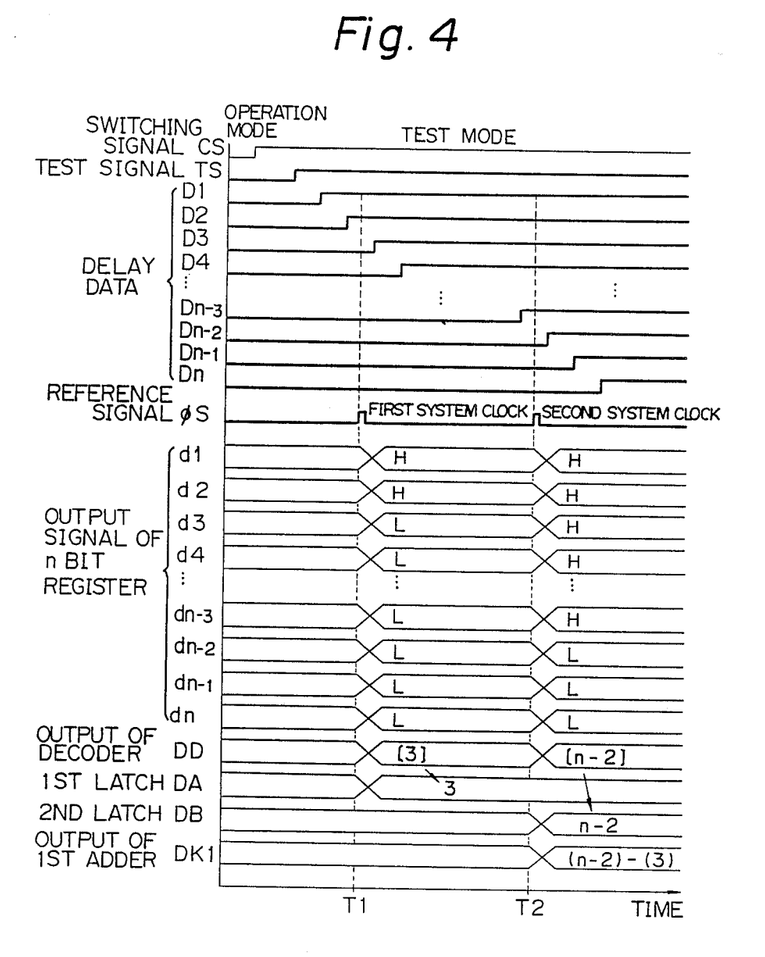
FIG. 4 shows waveforms for explaining the operation of the circuit for detecting a phase difference when the test signal is applied as shown in FIG. 2.

FIG. 4 shows waveforms for explaining the operation of the test mode of the circuit in FIG. 2. This test mode is executed before an operation mode in which a phase difference between two digital signals is detected. In this test mode, the switching signal CS changes from a low level to a high level, thereby the test signal TS is applied to the n stage delay circuit 21 through the selector 20. The phase difference between this test signal and the system clock $\phi$ S is previously specified.

When the test signal TS rises from a low level to a high level within the predetermined time after the change of the switching signal CS from low level to high level, this test signal TS is delayed in time by each delay element in the n stage delay circuit 21. The delay data D1 to Dn in FIG. 4 shows that the change of the output signal from the n stage delay circuit 21 is shifted in turn with the same time separation at each change.

Before the change of the test signal TS is delivered to the last delay element of the n stage delay circuit 21, the system clock signal (reference signal) φ S is twice input to the n bit register 22 with the cycle time separation. In this embodiment, the change of the test signal TS is delivered to the second delay element of the n stage delay circuit 21 when the first system clock φ S is applied at time T1, and the change of the test signal is delivered to the (n−3)th delay element of the n stage delay circuit 21 when the second system clock φ S is applied at time T2.

Accordingly, when the first system clock φ S is applied to the n bit register 22 at time T1, only two delay data D1 and D2 are at a high level and the rest of the delay data are all at a low level, and when the second system clock φ S is applied to the n bit register 22 at time T2, the delay data D1 to $D_{n-3}$ are at a high level and three delay data $D_{n-2}$ to $D_n$ are at a low level. Thus the n bit register 22 latches the n bit data "H H L L L ... L L L" and outputs the same data to the encoder 23 at time T1, and latches the n bit data "H H H ... H H L L L" and outputs the same data to the encoder 23 at time T2. The encoder 23 then converts the n bit data "H H L L L ... L L" into the numerical value "3" at time T1, and converts the n bit data "H H H ... H H L L L" into the numerical value "(n−2)" at time T2. The encoder 23 outputs this data as an output signal DD to the compensation circuit 24.

The switching signal CS is also input to the compensation circuit 24, so that the mode information (whether it is a test mode or an operation mode) is delivered to the compensation circuit 24. After the switching signal CS changes from low level to high level, that is a test mode, the compensation circuit 24 latches the first data in the signal DD from the encoder 23 in the first latch circuit 24a and latches the second data in the signal DD from the encoder 23 in the second latch circuit 24b, so that the first numerical value "3" is latched in the first latch circuit 24a at time T1, and the second numerical value "(n−2)" is latched in the second latch circuit 24b at time T2. Thus, the numerical value "3" is output from the first latch circuit 24a as a signal DA after time T1, and the numerical value "(n−2)" is output from the second latch circuit as a signal DB after time T2.

The signal DA is applied to the inverted input terminal of the first adder 24c and the signal DB is applied to the noninverted input terminal of the first adder 24c, thereby the calculation of (n−2)−3 is executed by the adder 24c, and this numerical value (n−2)−3 is output to the divisor input of the divider 24e as an output signal DK1 after time T2. This numerical value (n−2)−3 indicates the number of the delay elements in the n stage delay circuit 21 between the first and the second system clock φ S, and this numerical value (n−2)−3 is used to compensate the phase difference data in the operation mode which is explained later.

Figure 5:
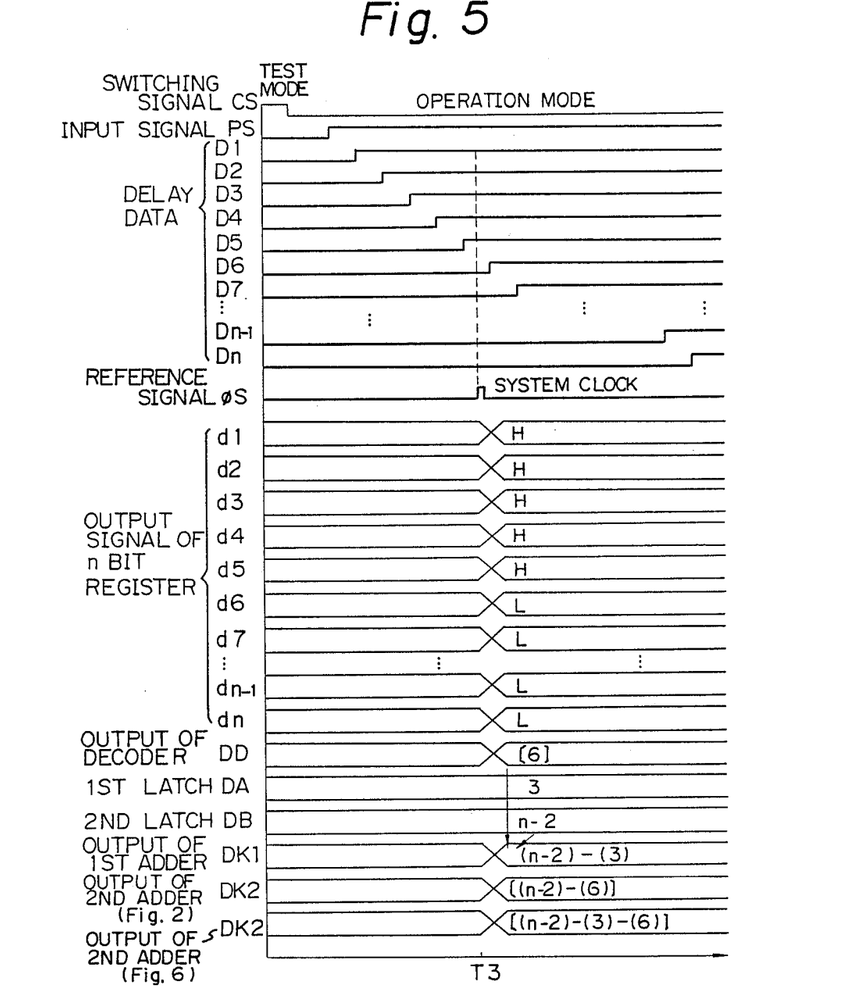
FIG. 5 shows waveforms for explaining the operation of the circuit for detecting a phase difference when the signal to be subjected to phase difference detection is applied as shown in FIG. 2.

FIG. 5 shows waveforms for explaining the operation of the operation mode of the circuit in FIG. 2 where the signal PS to be subjected to phase difference detection is applied to the selector 20. This operation mode is executed after the test mode described above. In this operation mode, the switching signal CS changes from a high level to a low level, thereby the input signal PS is applied to the n stage delay circuit 21 through the selector 20.

When the input signal PS rises from a low level to a high level within the predetermined time after the change of the switching signal CS from low level to high level, this input signal PS is delayed in time by each delay element in the n stage delay circuit 21. The delay data D1 to Dn in FIG. 5 shows that the change of the output signal from the n stage delay circuit 21 is shifted in turn with the same time separation at each stage.

If the change of the input signal PS is delivered to the fifth delay element of the n stage delay circuit 21, when the system cock signal φ S is applied to the n bit register 22 at time T3, the delay data D1 to D5 are at a high level and the delay data D6 to Dn are at a low level. Thus at time T3, the output signals d1 to d5 of the n bit register 22 are at a high level and the output signals d6 to dn of the n bit register 22 are at a low level. The encoder then converts the n bit data "H H H H H L L ... L L L" into the numerical value "6" at time T3. The encoder 23 outputs this data as the output signal DD to the compensation circuit 24.

In the operation mode, the low level switching signal CS is applied to the compensation circuit 24, so that the compensation circuit 24 is actuated to compensate the input signal DD from the encoder 23 and generate the phase difference information signal PD. When the numerical value "6" is applied to the compensation circuit 24 from the encoder 23 as the signal DD at time T3, this numerical value "6" is delivered to an inverted input terminal of the second adder 24d and not latched in any latch circuit in the operation mode. The numerical value "(n−2)" latched in the second latch circuit 24b has been input to the noninverted input terminal of the second adder 24d, so that the calculation of (n−2)−6 is executed by the second adder 24d, and this numerical value "(n−2)−6" is output to the dividend input of the divider 24e as an output signal DK2 after time T3.

The divider 24e makes the phase difference information signal PD by division using the data "(n−2)−3" input to the divisor input terminal and the data "(n−2)−6" input to the dividend input terminal. In this embodiment, the phase difference information signal PD is calculated as follows:

$$PD = (n-2) - 6 / (n-2) - 3 \qquad 1$$

In this way, the phase difference between the test signal TS and the input signal PS is obtained in the form of a time ratio.

Figure 6:
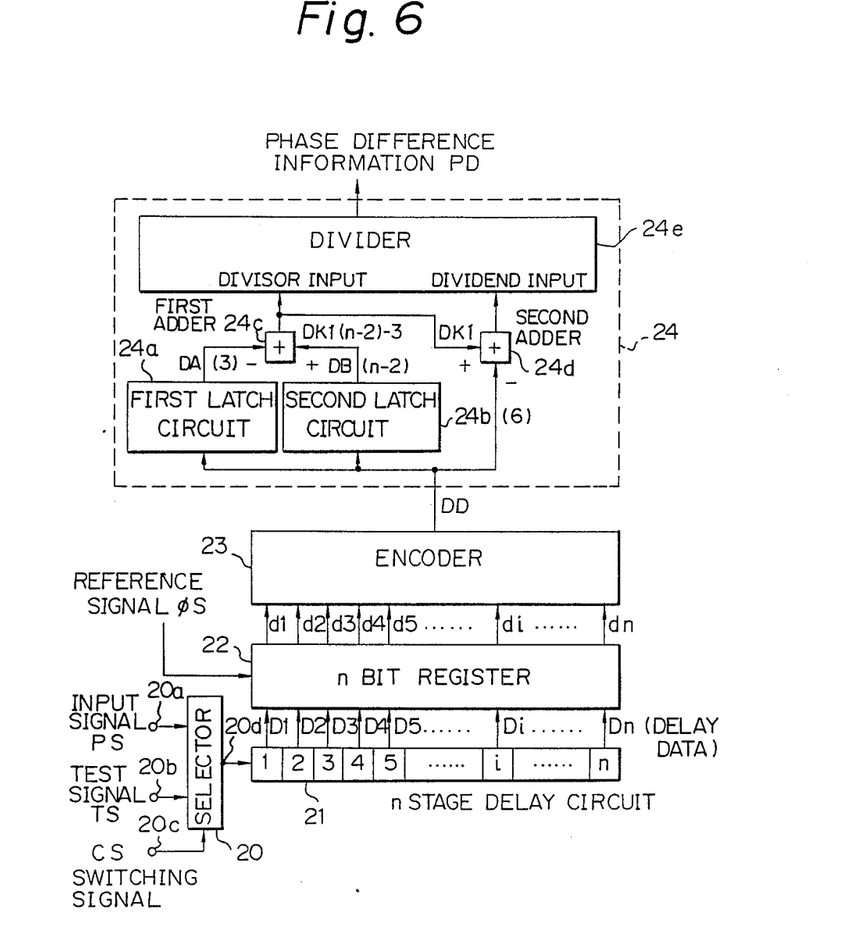
FIG. 6 is a modification of the circuit shown in FIG. 2 according to the present invention.

FIG. 6 is a circuit diagram of a modification of the first embodiment shown in FIG. 2. The only difference between the circuit in FIG. 2 and the circuit in FIG. 6 is the input signal of the second adder 24d, so that only that difference between the two circuits will be explained hereinafter. The noninverted input terminal of the second adder 24d is connected to the output terminal of the second latch circuit 24b in FIG. 2, while the noninverted input terminal of the second adder 24d is connected to the output terminal of the first adder 24c in FIG 6. From this difference, the calculation of ((n−2)−3)−6 is executed by the second adder 24d, and this numerical value "((n−2)−3)−6" is output to the dividend input of the divider 24e as an output signal DK2 after time T3.

In this embodiment, the phase difference information signal PD is calculated as follows:

$$PD = ((n-2) - 3) - 6 / (n-2) - 3 \qquad 1$$

This phase difference information signal PD obtained in the form of a time ratio, indicates the phase difference between the input signal PS and the reference signal (system clock) φ S.

The phase difference information between two digital signals obtained according to the present invention is used to correct a variation in the phase difference between two signals having a predetermined phase difference, such as a horizontal sychronizing signal and a color burst signal in a digital television set or in a color image display control apparatus.

For example, in a color image display control apparatus, information regarding a phase difference between the sampling clock and each horizontal synchronizing signal in the composite color picture signal is output by a phase difference information outputting circuit. Then, the digital image data in a line corresponding to each horizontal synchronizing signal, which was sampled by the sampling colck, is modified according to the above information so that a visible distortion in an image of the above processed data due to the above phase difference is corrected, by a digital data modifying circuit. The operation of the above digital data modifying circuit is carried out by replacing digital image data which was sampled at each cycle of the sampling clock, with a value obtained by a weighted average of the digital image data at its own cycle and digital image data at neighboring cycles, according to the above information. The ratio of the above phase difference to a cycle time of the sampling clock id used as a weight for the digital image data at the above neighboring cycles in the above weighted average operation.

We claim:

1. A method for detecting a phase difference between two digital signals in a phase difference detecting circuit including a delay circuit comprised of series-connected n delay elements having the same delay characteristics, an n bit register with each bit connected to connecting points of said delay elements respectively, and a compensation circuit for compensating a phase difference, comprising the steps of:
    applying a test signal to an input terminal of said delay circuit, and taking out a delayed test signal from each of said connecting points of said delay elements;
    applying a reference signal having a predetermined cycle twice to said n bit register time before said test signal applied to said delay circuit is delivered to the last delay element;
    taking in said delayed test signal to an n bit register when a first of said reference signals is applied to said n bit register and a second of said reference signals is applied to said n bit register, and taking out two kinds of delayed test signals from every bit of said n bit register on a one-by-one basis;
    latching said two kinds of delayed data one-by-one in a different data latching area in said compensation circuit;
    calculating delay characteristics of said delay circuit using said two kinds of delayed test signals and a predetermined cycle time of said reference signal;
    applying a first digital signal to be subjected to phase difference detection to said delay circuit, and taking out the delayed said first digital signal from every connecting point of said delay elements;
    applying a second digital signal which is equal to said reference signal to said n bit register;
    taking in said delayed first digital signal to said n bit register from said delay circuits when said second digital signal is applied to said n bit register, and taking out said delayed first digital signal at the same time;
    taking in said delayed first digital signal to said compensation circuit, and
    compensating said delayed first digital signal using calculated delay characteristics of said delay circuit and a predetermined cycle time of said reference signal.

2. A method as set forth in claim 1, further comprising the step of converting said signal from said n bit register into a numerical value and delivering this value to said compensation circuit.

3. A method as set forth in claim 1, wherein said reference signal is a system clock which has a frequency three or four times higher than the chrominance subcarrier in the circuit for processing a digital signal in a television set.

4. A method as set forth in claim 1, wherein said first digital signal is a horizontal synchronizing signal included in a television signal.

5. An apparatus for detecting a phase difference between two digital signals, comprising:
    a signal delay means for delaying an input signal composed of n series-connected delay elements each of which having the same delay characteristics and a connecting point of each delay element is connected to an output terminal thereof;
    a signal latching means having an n bit register connected to said n delay elements respectively for taking in the output signals from said signal delay means when a reference signal a cycle time of which is specified to be shorter than a total delay time of said delay means is applied to said signal latching means and delivering the same signals to n output terminals thereof;
    a signal encoding means having n input terminals connected to said n output terminals of said signal latching means for converting input signals from said signal latching means into a numerical value;
    a signal selecting means having a first input terminal for a test signal, a second input terminal for a signal to be subjected to phase difference detection, a third input terminal for a switching signal, and an output terminal connected to an input of said signal delay means, for selecting said first or second input terminal to connect said output terminal according to a switching signal applied to said third input terminal;
    a compensation means having a first signal latching circuit for latching a first said numerical value from said signal encoding means when said test signal is selected to be applied to said delay means, a second signal latching circuit for latching a second numerical value from said signal encoding means when said test signal is selected to be applied to said delay means, and a processing circuit for compensating the numerical value from said signal encoding means when said signal to be subjected to phase difference detection is selected to be applied to said delay means using said first numerical value latched in said first signal latching circuit and said second numerical value latched in said first signal latching circuit.

6. An apparatus as set forth in claim 5, wherein said processing circuit is comprised of a first adder which adds an inverted numerical value latched in said first signal latching circuit to said numerical value latched in said second latching circuit, a second adder which adds an inverted numerical value from said signal encoding means to said numerical value latched in said second signal latching circuit, and a divider having a divisor input terminal connected to said first adder and a dividend input terminal connected to said second adder, which divider divides a numerical value applied at a dividend input terminal by a numerical value applied at a divisor input terminal to produce a phase difference information signal indicating a phase difference between said test signal and a reference signal.

7. An apparatus as set forth in claim 5, wherein said processing circuit is comprised of a first adder which adds an inverted numerical value latched in said first signal latching circuit to said numerical value latched in said second signal latching circuit, a second adder which adds an inverted numerical value from said signal encoding means to a numerical value added by said first adder, and a divider having a divisor input terminal connected to said first adder and a dividend input terminal connected to said second adder, which divider divides a numerical value applied at said dividend input terminal by a numerical value applied at said divisor input terminal to produce a phase difference information signal indicating a phase difference between said signal to be subjected to phase difference detection and a reference signal.

8. An apparatus as set forth in claim 5, wherein said reference signal is a system clock which has a frequency of three or four times higher than the chrominance subcarrier in the circuit for processing a signal in a digital television set.

9. An apparatus as set forth in claim 5, wherein said first digital signal is a horizontal synchronizing signal included in a television signal.

* * * * *

UNITED STATES PATENT AND TRADEMARK OFFICE
CERTIFICATE OF CORRECTION

PATENT NO. : 4,963,817
DATED : Oct. 16, 1990
INVENTOR(S) : KOHIYAMA et al.

It is certified that error appears in the above-identified patent and that said Letters Patent is hereby corrected as shown below:

Col. 1, line 11, change "cock" to --clock--;
line 67, change "value" to --values--, and after "during" insert --which--.

Col. 2, line 64, change "fals" to --falls--.

Col. 3, line 42, change "elaments" to --elements--.

Col. 7, line 17, change "colck" to --clock--;
line 28, change "id" to --is--.

Signed and Sealed this

Eleventh Day of August, 1992

Attest:

DOUGLAS B. COMER

*Attesting Officer*    Acting Commissioner of Patents and Trademarks